(12) United States Patent
Fujiwara et al.

(10) Patent No.: US 12,100,467 B2
(45) Date of Patent: Sep. 24, 2024

(54) SYSTEMS AND METHODS FOR TESTING REDUNDANT FUSE LATCHES IN A MEMORY DEVICE

(71) Applicant: Micron Technology, Inc., Boise, ID (US)

(72) Inventors: Yoshinori Fujiwara, Boise, ID (US); Takuya Tamano, Boise, ID (US); Jason M. Johnson, Nampa, ID (US); Kevin G. Werhane, Kuna, ID (US); Daniel S. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/822,032

(22) Filed: Aug. 24, 2022

(65) Prior Publication Data

US 2024/0071560 A1 Feb. 29, 2024

(51) Int. Cl.
*G11C 29/02* (2006.01)
*G11C 29/00* (2006.01)
*G11C 29/24* (2006.01)
*G11C 29/44* (2006.01)
*G11C 29/46* (2006.01)

(52) U.S. Cl.
CPC ......... *G11C 29/789* (2013.01); *G11C 29/027* (2013.01); *G11C 29/24* (2013.01); *G11C 29/4401* (2013.01); *G11C 29/46* (2013.01)

(58) Field of Classification Search
CPC ..... G11C 29/789; G11C 29/027; G11C 29/24; G11C 29/4401; G11C 29/46; G11C 2029/1202; G11C 2029/1802; G11C 29/18
See application file for complete search history.

(56) References Cited

U.S. PATENT DOCUMENTS

| | | | |
|---|---|---|---|
| 2018/0330798 A1* | 11/2018 | You | G11C 29/787 |
| 2019/0130985 A1* | 5/2019 | Kim | G11C 17/18 |

* cited by examiner

*Primary Examiner* — Jay W. Radke
(74) *Attorney, Agent, or Firm* — Fletcher Yoder, P.C.

(57) ABSTRACT

An electronic device includes multiple memory elements including multiple redundant memory elements. The electronic device also includes repair circuitry configured to remap data to the multiple memory elements when a failure occurs. The repair circuitry includes multiple fuse latches configured to implement the remapping. The repair circuitry also includes latch testing circuitry configured to test functionality of the multiple fuse latches. The latch testing circuitry includes selection circuitry configured to enable selection of a first set of fuse latches of the multiple fuse latches for a test separate from a second set of fuse latches of the multiple fuse latches that are unselected by the selection circuitry.

25 Claims, 5 Drawing Sheets

SYSTEMS AND METHODS FOR TESTING REDUNDANT FUSE LATCHES IN A MEMORY DEVICE

BACKGROUND

Field of the Present Disclosure

Embodiments of the present disclosure relate generally to the field of memory devices. More specifically, embodiments of the present disclosure relate to redundancy latches in a memory device.

Description of Related Art

Memory devices become increasingly complicated with multiple possible failures in the semiconductor manufacture of the memory devices. To mitigate these potential failures, the memory devices may be implemented with redundant memory elements that may be utilized when other memory elements have failed. These failed memory elements may be replaced by using redundancy latches, wherein the redundancy latches are used to store the locations (addresses) of failed memory elements to be repaired. Memory devices may include around 100,000 redundancy latches on any given design. Typically, the latches that are used for repairs are tested by testing repaired elements against intended repairs to confirm that fuses and latches are functioning properly. However, this test is used for latches corresponding to repaired elements while latches corresponding to unused repair elements are not tested. Furthermore, some tests may rely on the functionality of the array of memory elements. Functional defects in the array may negatively impact the accuracy of testing of the fuse latches.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Repair circuitry may be used to repair faulty memory using redundant rows and/or columns. The repair circuitry may route reads and writes to and from redundant memory cells in place of faulty memory cells. Fuse latches may be used to control where these repairs occur. To test these fuse latches, the repaired target cells may be tested. However, post-package repairs (PPR) and memory built-in self test (mBIST) customer repairs require the use of unused repair elements. Furthermore, the usage of these repairs has increased the number of redundant rows/columns.

To test fuse latches that correspond to unrepaired memory cells, the fuse latches may be loaded with a known value. A memory command (e.g., ACT) may be used to load an address that matches the known value. The value stored in the fuse latches may be compared with the address in the memory command. If the bits match, a match signal may be asserted. This comparison may be performed for multiple redundant rows/column for multiple redundant sets. The match signals may then be combined (e.g., via an OR gate) into a bank match signal to determine whether each fuse latch in a bank is functioning properly. Furthermore, the same process may be applied to multiple banks with their bank match signals combined (e.g., via an OR gate) into a single signal. This single signal may represent statuses of thousands, tens of thousands, or hundreds of thousands of redundancy latches without the ability to test granularity. To address this lack of granularity, values (e.g., addresses) may be latched using a test mode implemented using hardware/software along with using a token to individually address different redundant rows/columns. Furthermore, since global fuse latch tests may take a considerable amount of time to complete, a smaller test of fewer rows/columns may be performed using the token process for some repairs/tests.

Figure 1:
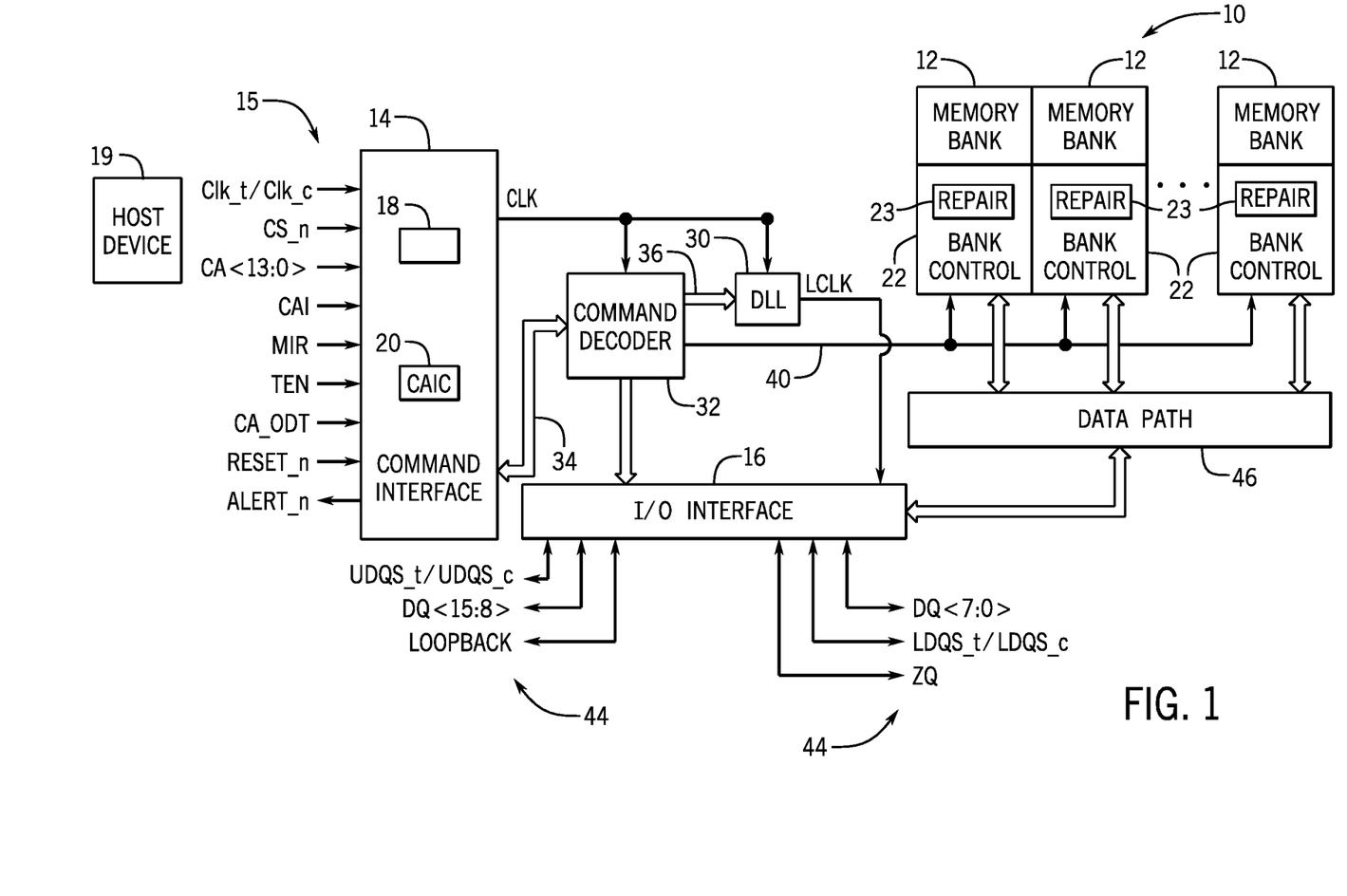
FIG. 1 is a simplified block diagram illustrating certain features of a memory device having repair circuitry having fuse latches, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared with prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x4, x8, or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges. The Clk_t and/or Clk_c may be received from a host device 19. The host device 19 may transmit any of the other command interface inputs or IO inputs described herein.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. For instance, the bank control block 22 may include repair circuitry 23 that may remap data in the memory banks 12 using redundant memory elements. For instance, the repair circuitry 23 may be used to implement redundant column repairs and/or redundant row repairs. Although the repair circuitry 23 is shown in the bank control block 22, the repair circuitry 23 may be included in alternative locations or distributed between various locations in the memory device 10, such as the command interface 14, command decoder 32, the IO interface 16, the data path 46, and/or the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include the command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals on DQ lines, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional DQ signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/Vss external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external Vdd and Vss signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
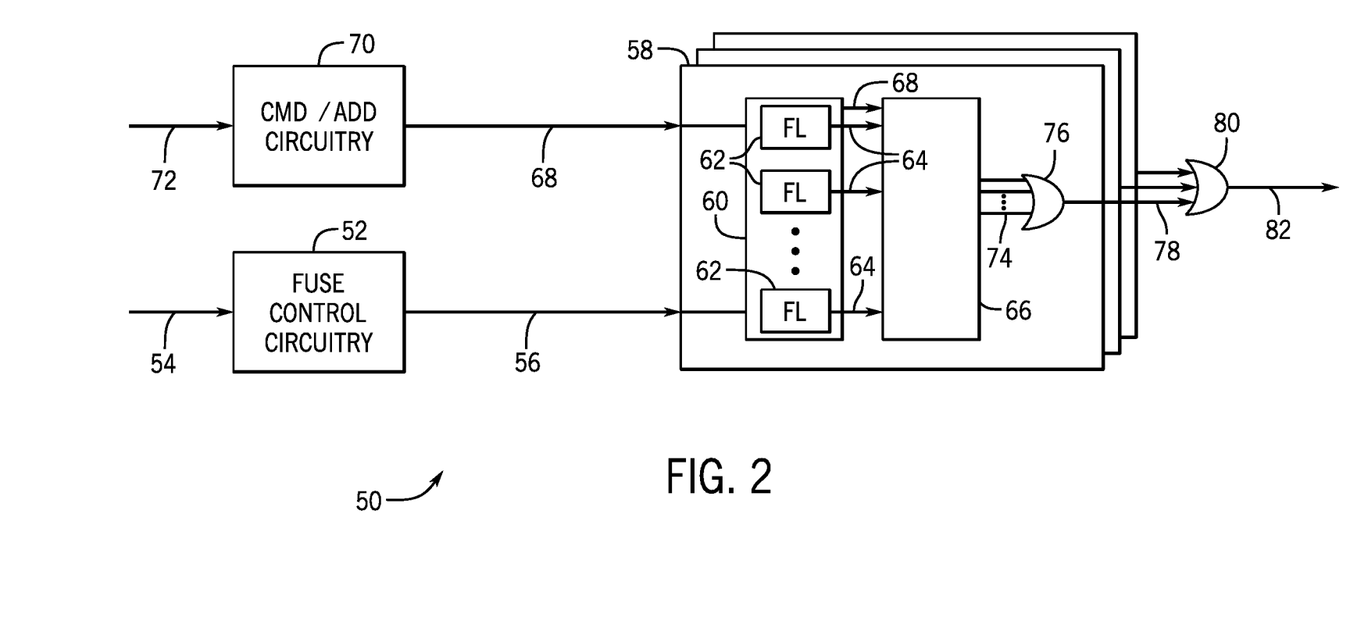
FIG. 2 is a circuit diagram of latch testing circuitry used to test the fuse latches of FIG. 1, according to an embodiment of the present disclosure.

FIG. 2 is a circuit diagram of latch test circuitry 50 that may be included in the repair circuitry 23 of FIG. 1. As illustrated, the latch test circuitry 50 includes fuse control circuitry 52 that receives a control signal 54 that is interpreted by the fuse control circuitry 52 into fuse transmitting lanes and fuse loading controls 56. The fuse control circuitry 52 may be implemented using hardware circuitry and/or software on the memory device 10 and/or executed by the host device 19. The control signal 54 may be transmitted to the memory device 10 from the host device 19. The fuse transmitting lanes and fuse loading controls 56 are used to load bits of a value (e.g., 111111, 000000, 101010, 010101, etc.) into a testing set 58 of the bank control 22. The testing set 58 may include the fuse latches of an entire bank 12 or may be smaller sets (e.g., 2, 4, 6, 8, 16, 32, etc.) of latch fuses. Specifically, the bits are loaded into respective fuse latches 62. Although the illustrated bank control includes three fuse latches 62. A single bank may include any number of respective fuse latches 62 to enable proper routing of repairs using redundant memory cells. The bits latched into the fuse latches 62 are then transmitted out as latched values 64 to one or more comparators 66. The one or more comparators 66 compare the latched values 64 to an internal address 68 that is also received at the one or more comparators 66 from CMD/ADD circuitry 70. The CMD/ADD circuitry 70 may include the command decoder 32 and may decode commands and translate addresses into the internal address 68 from an external command 72 having an external address.

Comparison signals 74 are output for the comparison between the latched values 64 and the bits of the internal address 68. The comparison signals 74 are combined using an OR gate 76 to generate a set signal 78 indicating the results of the comparisons to determine whether any errors have occurred for the testing set 58 and/or bank 12 corresponding to the bank control 22. The set signals 78 from multiple testing sets 58 (e.g., across multiple banks) are combined using an OR gate 80 to generate a combined test result 82. The combined test result 82 may be output to DQ (e.g., back to the host device 19).

Figure 3:
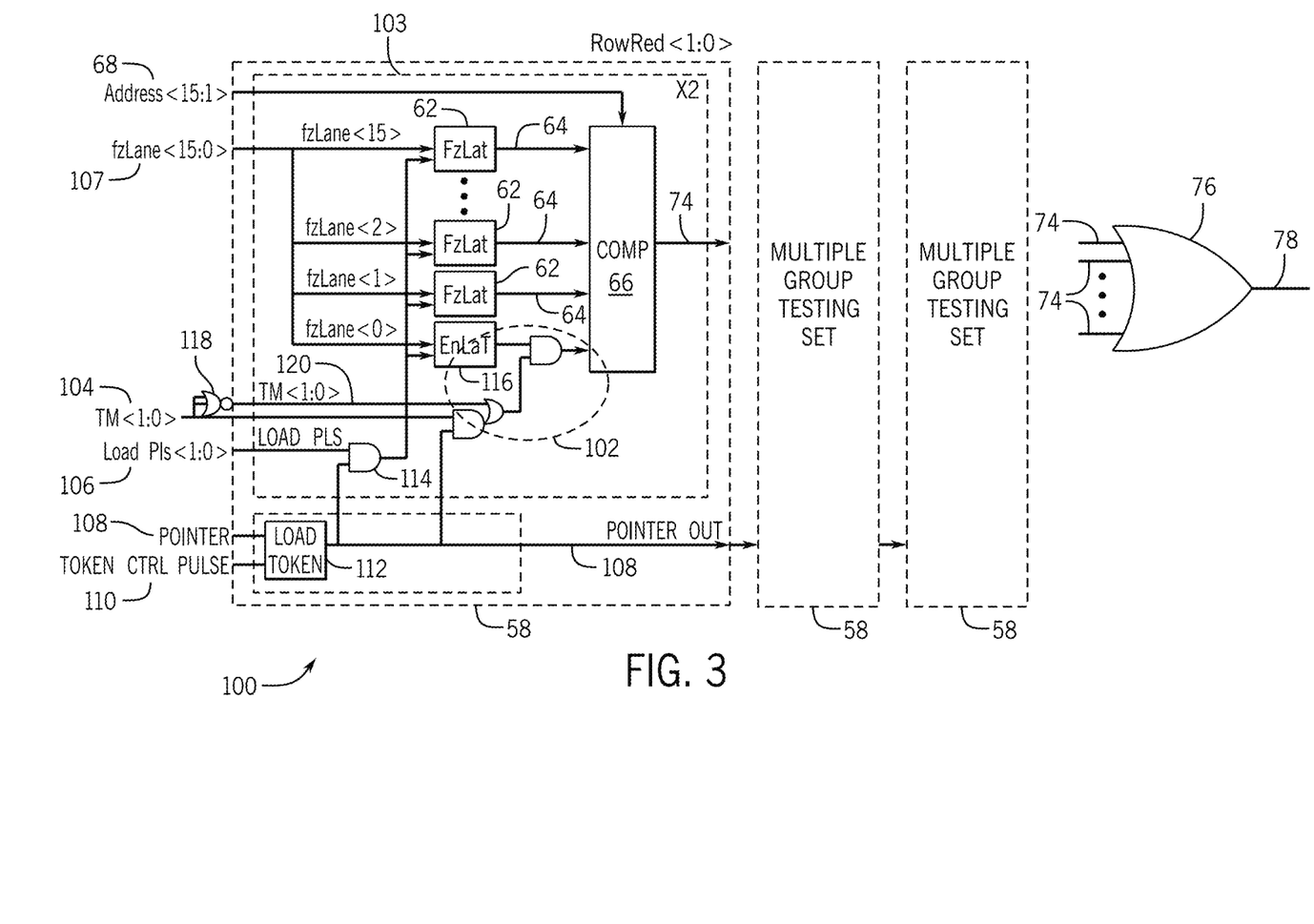
FIG. 3 is a circuit diagram of latch testing circuitry used to test the fuse latches of FIG. 1 with the latch testing circuitry having selection circuitry to select testing sets individually, according to an embodiment of the present disclosure.

FIG. 3 is a circuit diagram of latch test circuitry 100 that may be included in the repair circuitry 23 of FIG. 1 that includes selection circuitry 102 that enables selecting which fuse latch(es) to test. The testing sets 58 of the latch test circuitry 100 receive 15 bit addresses to test 30 fuse latches 62. The fuse latches 62 in a testing set 58 of the latch test circuitry 100 are grouped into two different groups 103. Only one group 103 of 15 fuse latches 62 is shown, but the other group of the testing set 58 functions similar to the shown group 103 when the other group is selected. The latch test circuitry 100 receives a target modifier 104 that is used to select which of the two groups of the testing set is selected. The latch test circuitry 100 further receives a load pulse signal 106 that is used to control when fuse values 107 are to be loaded into respective fuse latches 62. The fuse values 107 may be part of the fuse transmitting lanes and fuse loading controls 56.

The latch test circuitry 100 also receives a pointer 108 that acts as a token to select one or more of the testing sets 58 to be tested at a time. In other words, the pointer 108 may be a token that is used to select the one or more testing sets. For instance, the pointer 108 may be a string where a specific bit in the string corresponds to each testing set 58. The latch test circuitry 100 may also receive a token control pulse signal 110 that controls when the pointer 108 (the respective bit for the respective testing set 58) is received. For instance, a load token latch 112 may load in the appropriate portion of the pointer 108 when the token control pulse signal 110 is asserted. When the pointer 108 and the token control pulse signal 110 are asserted, the load token latch 112 outputs a logic high to an AND gate 114. While the logic high is output to the AND gate 114 and the load pulse signal 106 is asserted, the AND gate 114 outputs a load signal that causes the fuse latches 62 and an enable latch 116 to latch in the respective fuse values 107. When the load token latch 112 outputs a logic high to the AND gate 114, the load token latch 112 also outputs a logic high to the selection circuitry 102. When the logic high value is transmitted to the selection circuitry along with the correct target modifier 104 directly and from a NOR gate 118 configured as an inverter for the target modifier 104, the one or more comparators 66 are activated to compare the latched values 64 to internal address 68. The result of the comparisons may be combined (e.g., via the OR gate 76) or kept separate to generate the signal 78.

The pointer 108 is also shared with other testing sets 58 that functions similar to the above discussion related to the group 103. The respective signals 74 are transmitted to the OR gate 76 that in turn generates the combined test result 78. As may be understood, if the token selects the testing sets 58 successively, each group 103 may be tested individually. Furthermore, using specific addresses and fuse values 107, the fuse latches 62 may be individually tested and/or tested as a group 103.

Figure 4:
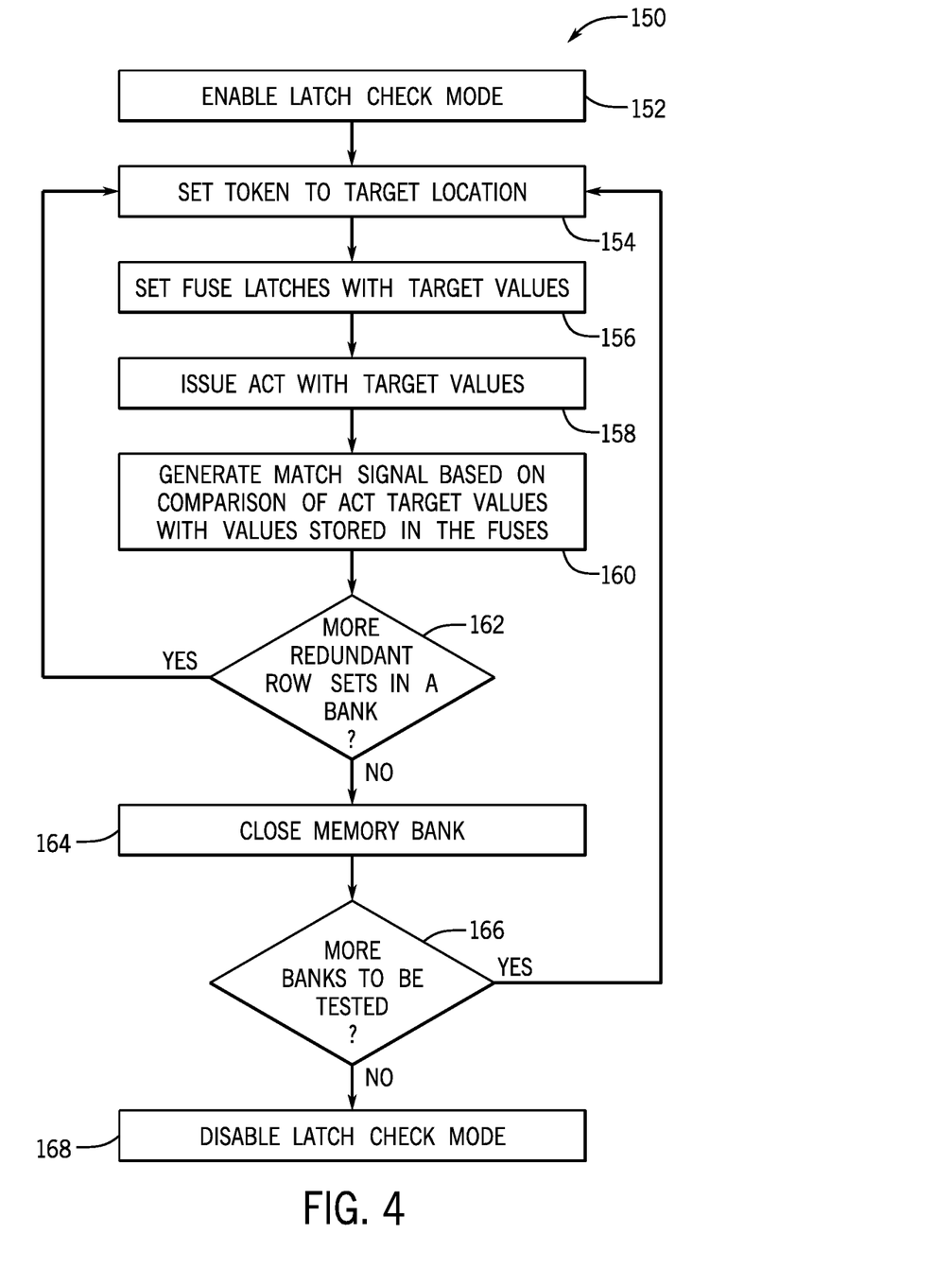
FIG. 4 is a flow diagram of a process for testing fuse latches corresponding to redundant rows using the latch testing circuitry of FIG. 3, according to an embodiment of the present disclosure.

FIG. 4 is a flow diagram of a process 150 for performing latch fuse testing in redundant rows. The host device 19 and/or the memory device 10 enables a latch check mode (block 152). For instance, the latch check mode may be enabled using a flag/signal/register. Additionally or alternatively, the signal/register may be multiple bits to select between different modes, such as monitoring row fuse sets on even cycles, monitoring row fuse sets on odd cycles, monitoring column fuse sets on even cycles, and/or monitoring column fuse sets on odd cycles. For instance, in the process 150, the enabled latch check mode may be a row fuse set check mode. The host device 19 and/or the memory device 10 may set the token value (e.g., bit string) to a target location (block 154). For instance, the bit(s) corresponding to the testing set(s) 58 to be tested at one time are set to a first value (e.g., 1) while other bits are set to another value (e.g., 0). The host device 19 and/or the memory device 10 then sets the fuses with the fuse values 107 (block 156). For instance, the host device 19 and/or the memory device 10 set the fuse values 107 and causes the load pulse 106 to be asserted.

The host device 19 then issues an ACT command (or another command) that corresponds to an internal address 68 that matches the fuse values 107 (block 158). The command also matches the bank address of the testing set(s) 58 being tested. In some embodiments, some test modes may enable consecutive ACT commands without a precharge (PRE) command between them. If multiple testing sets 58 are to be tested consecutively in a same bank, the host device 19 and/or the memory device 10 may activate such multiple-ACT test modes before issuing the ACT command.

As previously discussed, the latch test circuitry 100 causes the internal address 68 to be compared with the latched values 64 to generate match signal(s) (block 160). If there are more redundant row sets (e.g., testing sets 58) to be tested in the memory bank 12 without a PRE command between (block 162), the token is moved with the process moving back to block 154. In some embodiments, the internal address 68 on the address bus from the previous ACT command may be reused without issuing a new ACT command if the same memory bank 12 is to be used. However, if no other testing sets 58 are to be tested (or none are to be tested before a PRE command), the host device 19 and/or the memory device 10 may close the memory bank 12 (block 164). For instance, the memory bank 12 may be closed using a PRE command. If there are other memory banks 12 to be tested (block 166), the host device 19 and/or the memory device 10 returns the process to block 154. In some embodiments, the other memory banks 12 may be tested using a different test mode thereby causing the process to return to block 152. If there are no other memory banks 12 to test, the host device 19 and/or the memory device 10 may disable the latch check mode (block 168).

Figure 5:
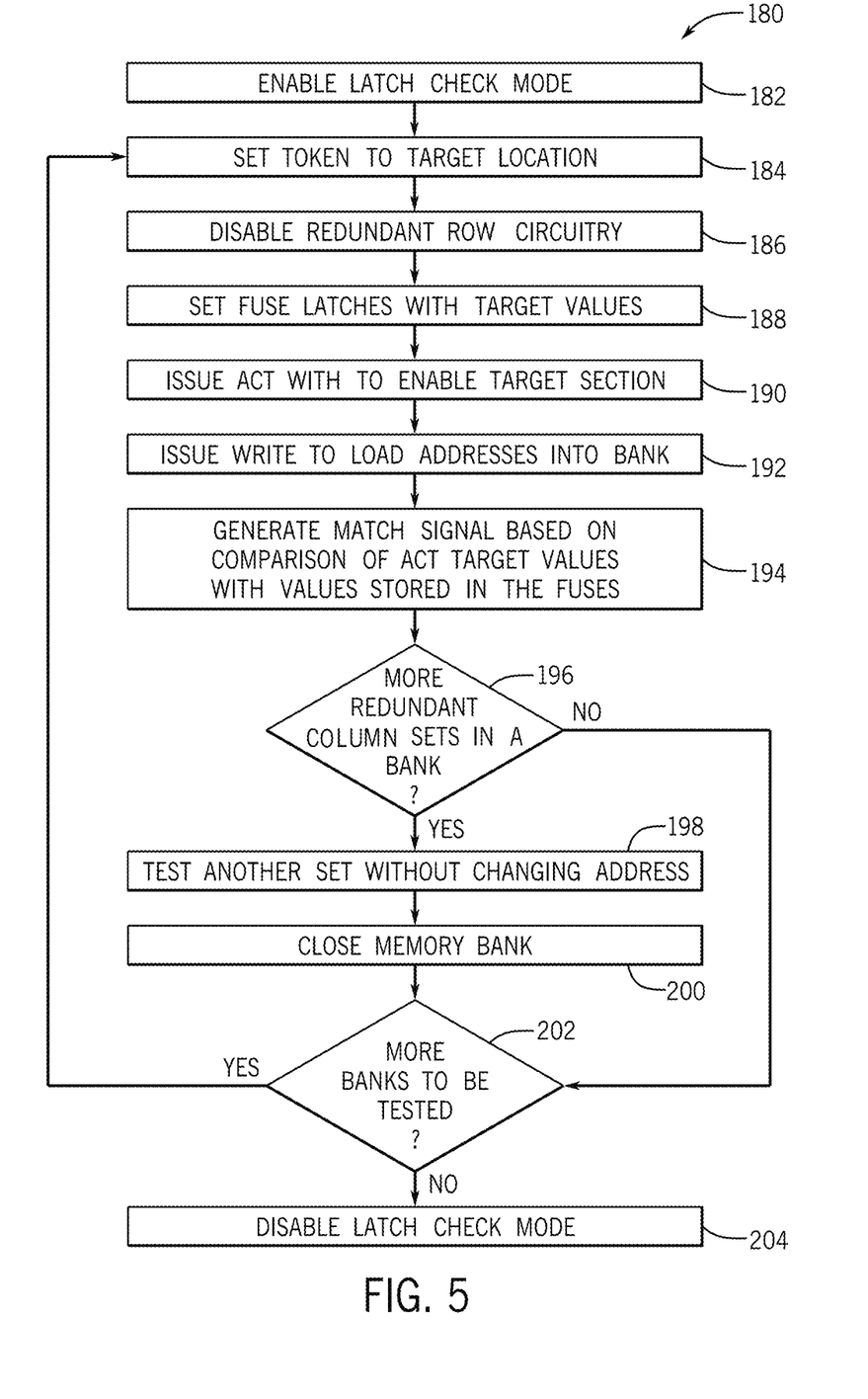
FIG. 5 is a flow diagram of a process for testing fuse latches corresponding to redundant columns using the latch testing circuitry of FIG. 3, according to an embodiment of the present disclosure.

FIG. 5 is a flow diagram of a process 180 for performing latch fuse testing in redundant columns. The host device 19 and/or the memory device 10 enables a latch check mode (block 182). As previously mentioned, the latch check mode may be set using a signal/register with multiple bits to select between different modes, such as monitoring different parts of row and/or column fuse sets using the load pulse signal 106. For instance, in the process 180, the enabled latch check mode may be a column fuse set check mode. The host device 19 and/or the memory device 10 may set the token value (e.g., bit string) to a target location (block 184). For instance, the bit(s) corresponding to the testing set(s) 58 (e.g., of a segment of a column) to be tested at one time are set to a first value (e.g., 1) while other bits are set to another value (e.g., 0). Since the redundant row testing and redundant column testing may use different but similar testing sets 58 and related circuitry with a shared match signal path, the host device 19 and/or the memory device 10 may disable the redundant row circuitry used in the process 150 to ensure that the match signal state for row circuitry is defaulted to a low value. Furthermore, column redundancy is divided between row address groups. Thus, disabling row redundancy can ensure that correct column redundancy groups are selected per row address groups. If a row match fires, a selected column redundancy group would belong to a row redundancy location, which could be different from the target column redundancy groups. To avoid this issue, the row redundancy testing may be disabled during column redundancy testing. The host device 19 and/or the memory device 10 then sets the fuses with the fuse values 107 (block 188). For instance, the host device 19 and/or the memory device 10 set the fuse values 107 and causes the load pulse 106 to be asserted.

The host device 19 then issues an ACT command that enables a column segment that is to be tested (block 190). In some embodiments, the column segment could be an entire column. Additionally or alternatively, a column may correspond to thousands of fuse latches and may be segmented to divide the testing into more granular testing. The host device 19 and/or the memory device 10 then use a write, read, and/or column command to load an internal address 68 that matches the fuse values 107 (block 192). The write command also matches the bank address of the testing set(s) 58 being tested.

As previously discussed, the latch test circuitry 100 causes the internal address 68 to be compared with the latched values 64 to generate match signal(s) (block 194). If there are more redundant column sets (e.g., testing sets 58) to be tested in the memory bank 12 without changing the address (block 196), those tests/comparisons are also made (block 198).

If no other testing sets 58 are to be tested in the memory bank 12, the host device 19 and/or the memory device 10 may close the memory bank 12 (block 200). For instance, the memory bank 12 may be closed using a PRE command. If there are other memory banks 12 to be tested (block 202), the host device 19 and/or the memory device 10 returns the process to block 184. In some embodiments, the other memory banks 12 may be tested using a different test mode thereby causing the process to return to block 182. If there are no other memory banks 12 to test, the host device 19 and/or the memory device 10 may disable the latch check mode (block 204).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims. For example, AND gates may be replaced with NAND gates with opposite polarity of signals. Additionally or alternatively, inverters (e.g., inverting amplifiers) may be employed while maintaining the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
a plurality of memory elements comprising a plurality of normal memory elements and a plurality of redundant memory elements; and
repair circuitry configured to remap an address for the plurality of normal memory elements to the plurality of redundant memory elements when a failure occurs, wherein the repair circuitry comprises:
a plurality of fuse latches configured to implement the remapping; and
latch testing circuitry configured to test functionality of the plurality of fuse latches, wherein the latch testing circuitry comprises selection circuitry configured to enable selection of a first set of fuse latches of the plurality of fuse latches for a test separate from a second set of fuse latches of the plurality of fuse latches that are unselected by the selection circuitry.

2. The electronic device of claim 1, wherein the first set of fuse latches comprises a first group of fuse latches and a second group of fuse latches.

3. The electronic device of claim 2, wherein the first group of fuse latches comprises 15 fuse latches, and the second group of fuse latches comprises 15 fuse latches.

4. The electronic device of claim 2, wherein the latch testing circuitry is configured to receive a target modifier that is configured to identify the first group of fuse latches or the second group of fuse latches in the first set of fuse latches for testing at a time.

5. The electronic device of claim 2, wherein the repair circuitry comprises token circuitry that receives a token indicating that the first set of fuse latches is to be tested.

6. The electronic device of claim 5, wherein the token comprises a bit string with a bit of the bit string corresponding to the first set of fuse latches and not the second set of fuse latches.

7. The electronic device of claim 6, wherein the bit string and target modifier identify only a single group of a single set of the plurality of fuse latches for testing.

8. The electronic device of claim 6, wherein the latch testing circuitry comprises a token latch that receives the bit of the bit string and a token control pulse signal that controls when to latch the bit into the token latch.

9. The electronic device of claim 8, wherein the selection circuitry comprises testing set selection circuitry corresponding to each group of each set of plurality of fuse latches.

10. The electronic device of claim 9, wherein the first group of fuse latches is configured to latch in fuse values based at least in part on an output of the token latch being asserted and a load pulse signal being asserted and received at the fuse latches.

11. The electronic device of claim 9, comprising one or more comparators that are configured to compare latched values from the first group of fuse latches based at least in part on an output of the token latch being asserted.

12. An electronic device, comprising:
a plurality of memory elements;
a plurality of redundant memory elements; and
repair circuitry configured to remap data from the plurality of memory elements to the plurality of redundant memory elements when a failure occurs, wherein the repair circuitry comprises:
a plurality of testing sets of fuse latches each comprising two groups each comprising:
a plurality of fuse latches configured to implement the remapping of the data from the plurality of memory elements to the plurality of redundant memory elements;
a token latch configured to latch at least a portion of a token used to select a target testing set of the plurality of testing sets;
a logic gate configured to cause latching of fuse values into the plurality of fuse latches of the target testing set based at least in part on an assertion of an output of the token latch;
one or more comparators; and
selection circuitry configured to cause the latched fuse values to be compared with an internal address in the one or more comparators, wherein an output of the one or more comparators indicates whether the plurality of fuse latches of the target testing set are functional.

13. The electronic device of claim 12, wherein the internal address is loaded onto an address bus using a respective memory command received at the electronic device from a host device.

14. The electronic device of claim 13, wherein the respective memory command comprises an activate (ACT) command when testing redundant rows and a write, read, or column command when testing redundant columns.

15. The electronic device of claim 12, wherein the logic gate comprises an AND gate.

16. The electronic device of claim 15, wherein the AND gate is configured to gate latching of the fuse latches until the AND gate receives an assertion of a load pulse.

17. The electronic device of claim 16, wherein an output of the AND gate is also configured to latch a respective fuse value in an enable latch.

18. The repair circuitry of claim 17, wherein the selection circuitry is configured to gate the output of the enable latch unless an output of the token latch is asserted.

19. The repair circuitry of claim 18, wherein the selection circuitry is configured to gate the output of the enable latch unless token latch output asserted and a respective target modifier indicates the respective group of the two groups.

20. A method, comprising:
via a host device, enabling a latch check mode of a memory device;
setting a value of a pointer to select a target testing set having a plurality of fuse latches;
latching fuse values in the plurality of fuse latches based at least in part on the value of the pointer;
loading an internal address to an address bus that matches the fuse values;
comparing the latched fuse values with the internal address based at least in part on the value of the pointer; and
outputting an indication of whether there is a fault in the latched fuse values based on the comparison of the latched fuse values and the internal address.

21. The method of claim 20, wherein enabling the latch check mode for the memory device comprises enabling a latch check mode for redundant rows of the memory device.

22. The method of claim 21, wherein loading the internal address comprises transmitting an activate (ACT) command to the memory device with an external address that corresponds to the internal address.

23. The method of claim 22, comprising setting a test mode to enable consecutive ACT commands without issuing a precharge (PRE) command between the ACT commands for successive tests of different testing sets of the memory device.

24. The method of claim 20, comprising:
opening a memory bank comprising the target testing set with an (ACT) command before comparing the latched fuse values with the internal address; and
closing the memory bank with a precharge (PRE) command after comparing the latched fuse values with the internal address.

25. The method of claim 24, wherein loading the internal address onto the address bus comprises loading the internal address on the address bus using a write, read, or column command prior to comparing the latched fuse values with the internal address when the testing set is in a redundant column of the memory device.

* * * * *